(12) United States Patent
Chuang et al.

(10) Patent No.: US 10,297,505 B2
(45) Date of Patent: May 21, 2019

(54) SEMICONDUCTOR DEVICE AND FABRICATION METHOD THEREFOR

(71) Applicant: TAIWAN SEMICONDUCTOR MANUFACTURING COMPANY, LTD., Hsinchu (TW)

(72) Inventors: Kuo-Sheng Chuang, Hsinchu (TW); You-Hua Chou, Hsinchu (TW); Yusuke Oniki, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 5 days.

(21) Appl. No.: 15/877,958

(22) Filed: Jan. 23, 2018

(65) Prior Publication Data

US 2018/0315661 A1 Nov. 1, 2018

Related U.S. Application Data (60) Provisional application No. 62/490,242, filed on Apr. 26, 2017.

(51) Int. Cl.
*H01L 21/8234* (2006.01)
*H01L 27/092* (2006.01)
*H01L 27/088* (2006.01)
*H01L 21/02* (2006.01)

(52) U.S. Cl.
CPC ........... *H01L 21/823462* (2013.01); *H01L 21/02282* (2013.01); *H01L 21/823431* (2013.01); *H01L 21/823468* (2013.01); *H01L 27/0886* (2013.01); *H01L 27/092* (2013.01); *H01L 27/0924* (2013.01); *H01L 27/0928* (2013.01)

(58) Field of Classification Search
None
See application file for complete search history.

(56) References Cited

U.S. PATENT DOCUMENTS

| | | | | |
|---|---|---|---|---|
| 9,048,219 | B2 * | 6/2015 | Kim | H01L 27/0924 |
| 9,607,838 | B1 * | 3/2017 | Lin | H01L 29/7842 |
| 2016/0218192 | A1 * | 7/2016 | Doris | H01L 27/0924 |
| 2017/0243869 | A1 * | 8/2017 | Chang | H01L 21/823821 |

* cited by examiner

*Primary Examiner* — Minh Loan Tran
(74) *Attorney, Agent, or Firm* — Hauptman Ham, LLP (57) ABSTRACT

A method of manufacturing a semiconductor device includes forming a first insulating film over a first fin structure and a second insulating film over a second fin structure, coating a protective layer over the second insulating film, removing the first insulating film to expose a portion of the first fin structure, and forming a first oxide film over the exposed portion of the first fin structure using a non-aqueous solvent-based chemical.

20 Claims, 11 Drawing Sheets

SEMICONDUCTOR DEVICE AND FABRICATION METHOD THEREFOR

BACKGROUND

When a semiconductor device, such as a metal-oxide-semiconductor field effect transistor (MOSFET) or a MOS capacitor, is scaled down through various technology nodes, a high dielectric constant κ (high-κ) dielectric (as compared to silicon dioxide) and a conductive material are used to form a gate structure. In the gate structure, an interfacial layer is used to improve an interface between a surface of a substrate and the high-κ dielectric for reducing damage and defects. The interfacial layer is further configured to suppress a mobility degradation of channel carriers in the semiconductor device and to help improve stability of device performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Silicon dioxide ($SiO_2$) has been used as a gate dielectric film in a MOSFET for decades. As device features, such as a channel length and a spacing between devices, have decreased in size, a thickness of the gate dielectric film has decreased in order to maintain a gate capacitance and a threshold voltage (Vt). As a result of one or more of the foregoing decreases, leakage currents increased drastically, leading to more power consumption and reduced device reliability (e.g., time dependent dielectric breakdown (TBBD)). In order to provide a physically thicker gate dielectric film having a same equivalent oxide thickness (EOT) and capacitance equivalent thickness (CET) of silicon dioxide, a high-κ dielectric film is used to replace silicon dioxide. An interfacial layer (IL) is formed between the high-κ dielectric film and a substrate for passivating dangling bonds at a surface of the substrate and providing an interface of low interface trap density (Dit). The IL is also used to create a barrier against interfacial reactions and diffusion into a channel region of the device. However, when the IL includes a water soluble (i.e., removable by water) material, an aqueous solution involved in a wet oxidation process and/or a photoresist stripping process will cause a loss of IL, thereby adversely affecting device performance and/or increasing a likelihood of diffusion of dopants and impurities through the high-κ dielectric film.

In some embodiments, a non-aqueous solvent-based chemical is used for the wet oxidation process in order to help avoid the IL loss. In comparison with other approaches, the reduced IL loss has fewer charges/traps in the high-κ dielectric film from the interface, a smoother surface, and a smaller Vt shift. In some embodiments, the non-aqueous solvent-based chemical is used at the same time for the wet oxidation process and for the photoresist stripping process, resulting in a reduced manufacturing cost and/or processing time in comparison with other approaches.

Figure 1:
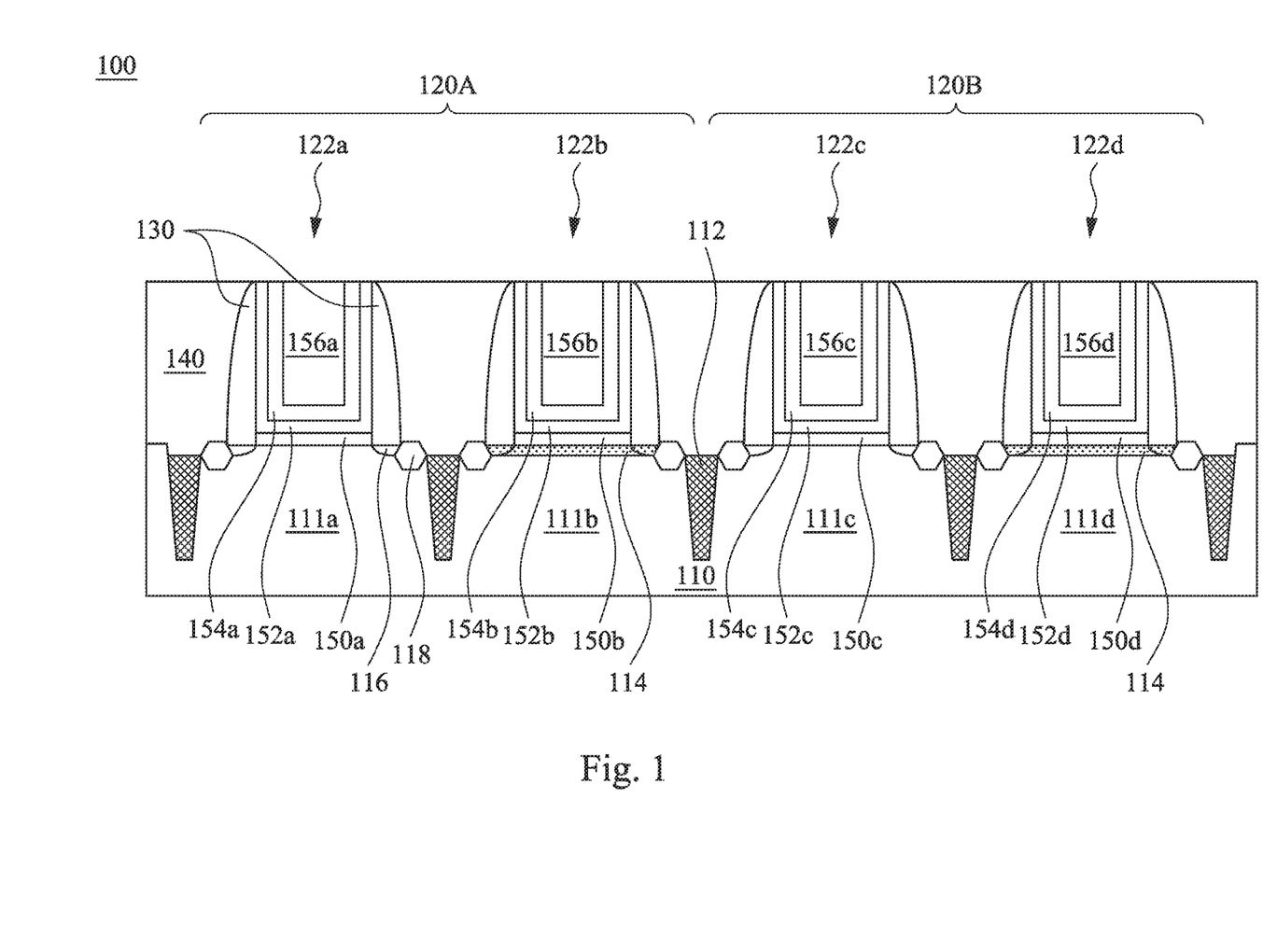
FIG. 1 is a cross-sectional view of a semiconductor device in accordance with one or more embodiments.

FIG. 1 is a cross-sectional view of a semiconductor device 100 in accordance with one or more embodiments. Semiconductor device 100 includes a substrate 110, which is divided into a first operating region 120A and a second operating region 120B, a plurality of fin structures 111*a-d* (collectively referred to as fin structure 111) and gate structures 122*a-d* (collectively referred to as gate structure 122). In a complementary MOS (CMOS) circuit design, an n-type transistor and a p-type transistor are used to construct logic devices or a bit cell in a memory structure. In at least one embodiment, gate structures 122*a*, 122*c* represent n-type transistors and gate structures 122*b*, 122*d* represent p-type transistors. In accordance with various circuit designs, at least one of gate structures 122 is configured to be an electrode of an active component, such as a transistor or a passive component, such as a resistor or a capacitor.

In some embodiments, substrate 110 includes a bulk semiconductor material, such as silicon, germanium, silicon germanium, silicon carbide, III-V compounds or another appropriate material. In some embodiments, the substrate is a silicon on insulator layer (SOI) substrate or a silicon on sapphire (SOS) substrate. Fin structures 111 extend from substrate 110. In some embodiments, fin structures 111 have angled or tapered sidewalls. Alternatively, fin structures 111 have substantially straight sidewalls. In some embodiments, fin structures 111 have a same material as substrate 110. In some embodiments, fin structures 111 have a different material from substrate 110.

A plurality of isolation features 112 is configured to separate one active area from another active area and/or to separate adjacent fin structures 111. That is, fin structures 111 are arranged in parallel along a first direction and isolation features 112 are between fin structures 111 and over substrate 110. A top surface of fin structures 111 is above a top surface of isolation feature 112. Isolation feature 112 includes a dielectric material, such as silicon oxide, silicon nitride or another suitable material. One of ordinary skill in the art would understand that in at least one embodiment semiconductor device 100 is free of fin structures 111 and gate structure 122 is over and in direct contact with substrate 110 that has a substantially planar surface. In such a way, isolation features 112 are in substrate 110 and are referred to as shallow trench isolation (STI) features.

First operating region 120A and second operating region 120B have different operating voltages. In at least one embodiment, first operating region 120A is defined as a core region and gate structures 122a-b are used for core circuits, and second operating region 120B is defined as an input/output (I/O) region and gate structures 122c-d are used for I/O circuits. The core circuit is configured to perform logic functions and peripheral circuits for coupling the logic functions to an external circuit, and the I/O circuit serves as an interface to communicate a high voltage signal to a low voltage device without component damage. In some embodiments, a transistor in a peripheral circuit having a relatively greater thickness of gate dielectric film is configured to sustain a greater threshold voltage applied to the peripheral circuit. Accordingly, gate structures 122c-d have a thicker gate dielectric film than gate structures 122a-b.

Each gate structure 122 has an IL 150a-d (collectively referred to as IL 150), a gate dielectric film 152a-d (collectively referred to as gate dielectric film 152), a work function layer 154a-d (collectively referred to as work function layer 154) and a conductive layer 156a-d (collectively referred to as conductive layer 156). IL 150 is between fin structure 111 and work function layer 154. In addition, IL 150 includes an oxide having a thickness ranging from about 5 angstrom (Å) to about 15 Å. A greater thickness of IL 150 adversely affects EOT of a transistor, in some instances. The EOT determines how thick a layer of silicon oxide would be to induce a same effect as a gate dielectric film being used. A smaller thickness of IL 150 increases a Dit between fin structure 111 and gate dielectric film 152, in some instances. IL 150b, 150d include a water-soluble oxide, such as germanium dioxide or lanthanum oxide. In some embodiments, IL 150a, 150c include a different oxide than that of IL 150b, 150d. In some embodiments, IL 150a, 150c include a same oxide as that of IL 150b, 150d.

Gate dielectric film 152 is between IL 150 and work function layer 154. Gate dielectric film 152 includes a high-κ dielectric, which is greater than a dielectric constant of silicon dioxide (i.e., approximately 3.9). In some embodiment, gate dielectric film 152 includes hafnium oxide, which has a dielectric constant that is in a range from about 18 to about 40. In alternative embodiments, gate dielectric film 152 includes one of zirconium dioxide, yttrium oxide, lanthanum oxide, gadolinium oxide, titanium dioxide, hafnium zirconate, or another suitable material. In some embodiments, gate dielectric film 152 has a thickness ranging from about 5 Å to about 50 Å.

Work function layer 154 is between gate dielectric film 152 and conductive layer 156 and is located within a cavity defined by gate dielectric film 152. In addition, work function layer 154 includes a material used to tune a work function of each gate structure 122 in order to achieve a desired threshold voltage, for example, gate structures 122a, 122c include an n-type work function material and gate structures 122b, 122d include a p-type work function material.

In some embodiments, a capping layer is between gate dielectric film 152 and work function layer 154. The capping layer is also configured to tune a threshold voltage of a transistor. In some embodiments, the capping layer is selectively in the p-type transistor. In some embodiments, the capping layer has a thickness ranging from about 5 Å to about 50 Å. A greater thickness increases difficulty of fabricating work function layer 154, in some instances. In some embodiments, the capping layer includes titanium nitride or tantalum nitride.

Conductive layer 156 is located within a cavity defined by work function layer 154. In some embodiments, a wetting layer, such as titanium, and/or a blocking layer, such as titanium nitride, is between gate work function layer 154 and conductive layer 156. Conductive layer 156 is configured to serve as a main conductive portion of gate structure 122. In some embodiments, conductive layer 156 includes at least one of aluminum, copper, titanium, tungsten, or another suitable material.

Semiconductor device 100 further includes a channel layer 114 below water-soluble IL 150b, 150d in each of first operating region 120A and second operating region 120B. In at least one embodiment, channel layer 114 includes germanium, such as silicon germanium, which has a germanium concentration ranging from about 15% to about 95% and a thickness ranging from about 4 nanometers (nm) to about 40 nm. In some embodiments, channel layer 114 is over the top surface of fin structure 111. Accordingly, a bottom surface of IL 150b, 150d is above a bottom surface of IL 150a, 150c. In some embodiments, channel layer 114 is in the fin structure 111 and the bottom surface of IL 150b, 150d is substantially coplanar with the bottom surface of IL 150a, 150c. In some embodiments, the bottom surface of IL 150b, 150d is below the bottom surface of IL 150a, 150c, for example, when fin structure 111 includes germanium and a channel layer of gate structures 122a, 122c is made of silicon and is deposited over the top surface of fin structure 111. In some embodiments, channel layer 114 includes a same material as fin structure 111; in some embodiments, channel layer 114 includes a different material from fin structure 111. One of ordinary skill in the art would understand that in some embodiments where semiconductor device 100 is free of fin structure 111, channel layer 114 is in substrate 110, or is over and in contact with substrate 110.

Semiconductor device 100 further includes spacers 130 and an inter-layer dielectric (ILD) 140. Spacers 130 are over fin structure 111 and along sidewalls of gate structure 122. In some embodiments, spacers 130 have an anisotropically etched shape, for example, a D shape (rounded), or an L shape (with a vertical portion and a horizontal portion) in order to define lightly doped drain (LDD) regions 116 to help avoid hot carrier injection (HCI). In some embodiments, spacers 130 include a single dielectric layer, such as silicon dioxide, silicon nitride, silicon oxynitride, silicon carbon nitride or another suitable material. In some embodiments, spacers 130 include multiple dielectric layers, for example, an oxide-nitride-oxide (ONO) structure. Based on various requirements of LDD regions, a thickness of spacers 130 ranges from about 100 Å to about 600 Å. A greater thickness results in an increased leakage current, in some instances. A smaller thickness increases a risk of HCI, in some instances.

In addition, at least a portion of source/drain features 118 is in fin structure 111 and at opposite sides of gate structure 122. In some embodiments, source/drain features 118 are an n-type doped region or a p-type doped region in fin structure 111. In some embodiments, source/drain features 118 are an epitaxial material, such as silicon germanium or silicon carbide, grown in a recess in fin structure 111. As such, source/drain features 118 protrude above the top surface of fin structure 111. The epitaxial material is configured to exert compressive/tensile stress to a channel region of a transistor in order to improve a carrier mobility. In some embodiments, source/drain features 118 are a doped epitaxial material.

ILD 140 is over spacers 130 and surrounds gate structure 122. ILD 140 is also referred to as an ILD0. In some embodiments, ILD 140 includes a single dielectric layer, such as silicon oxide, silicon nitride, undoped silicate glass (USG), boron silicate glass (BSG), phosphorus silicate glass (PSG), boron-phosphor-doped silicate glass (BPSG), fluorinated silicon glass (FSG), tetraethyl orthosilicate (TEOS) or another suitable dielectric material. In some embodiments, ILD 140 includes a low dielectric constant (low-κ) material, for example, a dielectric constant lower than silicon oxide. In some embodiments, ILD 140 includes an extreme low-κ (ELK) material, for example, a dielectric constant lower than 2.6. In some embodiments, ILD 140 includes multiple dielectric layers, such as USG and BSG.

Figure 2:
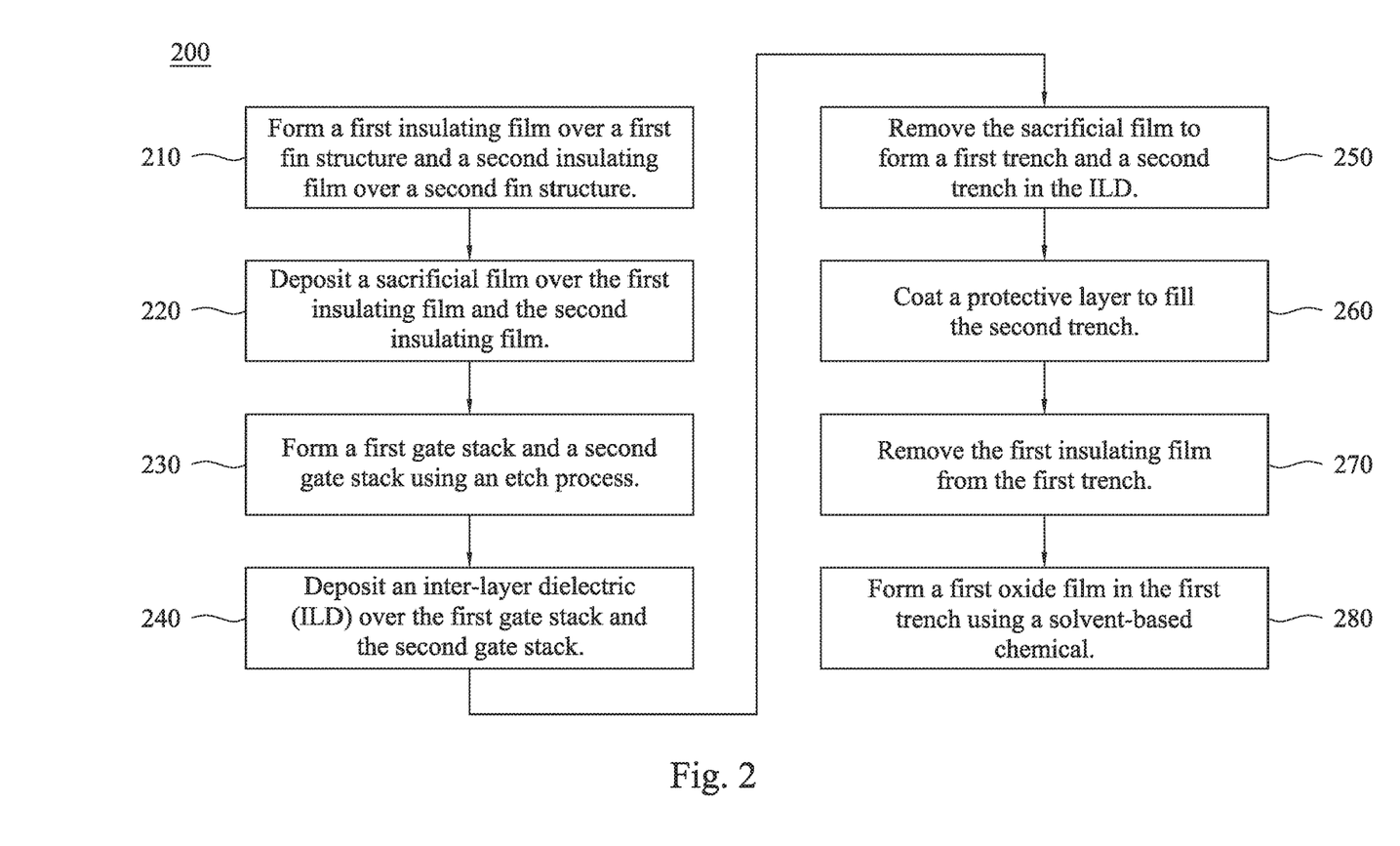
FIG. 2 is a flowchart of a method of fabricating a semiconductor device in accordance with one or more embodiments.

FIG. 2 is a flowchart of a method 200 of fabricating a semiconductor device in accordance with one or more embodiments. One of ordinary skill in the art would understand that additional operations are able to be performed before, during, and/or after method 200 depicted in FIG. 2, in some embodiments. Additional details of the fabricating process are provided below with respect to FIGS. 3A-3H, in accordance with some embodiments.

Method 200 includes operation 210 in which a first insulating film is formed over a first fin structure, e.g., fin structure 111b in FIG. 1, and a second insulating film is formed over a second fin structure, e.g., fin structure 111a in FIG. 1. The first insulating film corresponds to a core circuit region and the second insulating film corresponds to an I/O circuit region. Although a subsequent I/O gate dielectric film is substantially thicker than a core gate dielectric film, the first insulating film has a same thickness as that of the second insulating film, in some instances. For example, both the first and the second insulating films have a same thickness as an I/O gate dielectric film. In some embodiments, the first and the second insulating films are thermally grown oxide selectively formed over a top surface of the first fin structure and the second using in-situ silicon grown (ISSG), rapid thermal oxidation (RTO), or another appropriate method. In some embodiments, the first insulating film and the second insulating film are blanket deposited by using atomic layer deposition (ALD), chemical vapor deposition (CVD), physical vapor deposition (PVD), or another suitable process. In some embodiments, the first insulating film and the second insulating film are formed in a single step, for example, a thermal oxidation process. In some embodiments, the first insulating film and the second insulating film are formed in sequential steps, for example, after the thermal oxidation process of the first insulating film and the second insulating film, the first insulating film is removed by an acid and then another thermal oxidation process or deposition process is performed. In some embodiments where the semiconductor device is free of a fin structure, the first insulating film and the second insulating film are directly formed over a top surface of a substrate. At least one of the first fin structure or the second fin structure includes an aqueous soluble channel layer. In some embodiments where the first and the second fin structures include silicon, a germanium-containing channel layer is deposited over at least the first fin structure. In at least one embodiment, an upper portion of the first fin structure is removed before the deposition of the germanium-containing channel layer. In some embodiments where both the first and the second fin structure are deposited with the germanium-containing channel layer, an additional silicon channel layer is deposited over the germanium-containing layer in the second fin structure. In some embodiments where the first and the second fin structures include germanium or silicon germanium, a silicon channel layer is deposited over the second fin structure. In at least one embodiment, an upper portion of the second fin structure is removed before the deposition of the silicon channel layer.

Method 200 continues with operation 220 in which a sacrificial film is deposited over the first insulating film and the second insulating film. The sacrificial film is also called dummy poly, in some instances. In some embodiments, the sacrificial film includes polysilicon, amorphous silicon or a combination thereof. In some embodiments, the sacrificial film is deposited by using ALD, CVD, PVD, epitaxial growth or another suitable process. In some embodiments, the sacrificial film has a thickness ranging from about 50 Å to about 400 Å. A greater thickness increases manufacturing cost without significant benefit, in some instances. A smaller thickness increases a difficulty of a subsequent planarization process, in some instances. In some embodiments, the sacrificial film is formed in a conformal manner. That is, the sacrificial film has a substantially uniform thickness over the fin structures, along sidewalls of the fin structures and over an isolation feature. In at least one embodiment, after the formation of the sacrificial film, a hard mask film is deposited over the sacrificial film. The hard mask film includes silicon nitride, silicon oxide, silicon oxynitride or another appropriate material. In some embodiments, the hard mask film has a thickness ranging from about 100 Å to about 500 Å. The hard mask film is formed using ALD, CVD, PVD or another suitable process. Additionally, an anti-reflective coating (ARC) or a bottom anti-reflective coating (BARC) is formed over the hard mask film in order to enhance a subsequent lithography process, in some instances.

Method 200 continues with operation 230 in which a first gate stack and a second gate stack are formed using an etch process. A photoresist is coated on the hard mask film or the sacrificial film using a spin-on coating process, a dip coating method or an air-knife coating method. Next, an energy source, e.g., lithography exposure with a wavelength between from about 10 nm to about 1000 nm, is used to pattern the photoresist. The patterned photoresist defines a gate stack for an n-type device and a gate stack for a p-type device. In some embodiments, the gate stack for the n-type device and the gate stack for the p-type device is patterned in a single step. In some embodiments, the gate stack for the n-type device and the gate stack for the p-type device are patterned in subsequent steps. Next, an etch process is performed to remove the unpatterned portion of the hard mask film, the sacrificial film, the first insulating film and the second insulating film from the fin structure to form the first gate stack and the second gate stack. The etch process is followed by a formation of spacers along sidewalls of the first gate stack and the second gate stack. In some embodiments, source/drain features of the first gate stack and the second gate stack are formed in the first fin structure and the second fin structure. Exemplary source/drain features are formed by using an implantation method, or epitaxially growing a strained material in a recess. The recess is formed by removing a portion of the fin structure using an etching process.

Method 200 continues with operation 240 in which an ILD, e.g., ILD 130 in FIG. 1, is deposited over the first gate stack and the second gate stack. In some embodiments, before the formation of the ILD, an etch stop layer is conformally formed over the first gate stack, the second gate stack, the source/drain features and the fin structure. The etch stop layer provides sufficient etch selectivity relative to the ILD to reduce a risk of an etching process to form a contact plug in the ILD from damaging the source/drain features. The etch stop layer is used to protect the underlying gate stack and the source/drain features during a formation of a contact opening. The formation of the etch stop layer includes a deposition process, such as ALD, CVD, PVD or another suitable process. The etch stop layer includes a dielectric material, such as silicon nitride, silicon oxynitride, silicon carbonitride, or another suitable material. In some embodiments, the etch stop layer applies a stress to a channel region of a transistor by a using a strained material.

Afterward, the ILD is formed over the etch stop layer and between the first gate stack and the second gate stack. The formation of the ILD includes a deposition process, such as CVD, PVD, high density plasma (HDP), spin-on deposition (SOD), ALD or another suitable process. Based on a gate height of the gate stack, the ILD has a thickness ranging from about 90 nm to about 500 nm. A greater thickness increases a manufacturing cost and processing time, in some instances. A smaller thickness results in an insufficient coverage of the underlying gate stack. The formation of the ILD is followed by a planarization process, such as a CMP process, an etch process, or another suitable process to remove excess portions of the ILD in order to produce a substantially planar top surface for the gate stack. In some embodiments where the first gate stack and the second gate stack include a hard mask film, an entirety of the hard mask film and an upper portion of the spacers are removed during the planarization process. In some embodiments, the sacrificial film functions as a planarization stop layer. The planar top surface helps increase precision for a subsequent lithography process.

Method 200 continues with operation 250 in which the sacrificial film is removed to form a first trench and a second trench in the ILD. The sacrificial film is removed by an etching solution such as, for example, ammonium hydroxide solution, dilute hydrofluoric acid, and/or another suitable etchant. In some embodiments, the sacrificial film is removed by a dry etching process. Example etchants include fluorine and/or chlorine-based etchants. The removal process results in the first trench and the second trench being defined by the spacers within which a conductive layer such as metal will be filled in, as is typically performed in a gate replacement process, also referred to as a gate last technique. In some embodiments, the removal process is performed until the first insulating film and the second insulating film are exposed. In some embodiments, the removal process includes simultaneously removing the first and the second insulating films. In some embodiments, the removal of the first and the second insulating films includes sequential steps. In some embodiments, the removal of the first insulating film and the second insulating film includes liquid or gas phase diluted hydrofluoric acid.

Method 200 continues with operation 260 in which a protective layer is coated to fill the second trench. In some embodiments, the protective layer is a photoresist. In some embodiments where the first and the second insulating films are exposed and the thickness of the second insulating film equals that of an I/O gate dielectric film, the protective layer selectively coats the second trench. In some embodiments where the first and the second insulating films are removed during the removal of the sacrificial film, an I/O gate dielectric film is formed in the first and the second trenches, and the protective layer is formed over the second trench.

Method 200 continues with operation 270 in which the first insulating film is removed from the first trench. In some embodiments, the first insulating film is removed by an etching solution such as a combination of ammonium hydroxide solution and hydrofluoric acid, and/or another suitable etchant. In some embodiments, the first insulating film is removed by a dry etching process. Example etchants include chlorine-based etchants.

Method 200 continues with operation 280 in which a first oxide film, e.g., IL 150b in FIG. 1, is formed in the first trench using a non-aqueous solvent-based chemical. The non-aqueous solvent-based chemical includes an aqueous solution with a concentration smaller than 8% of the non-aqueous solvent-based chemical to help reduce a loss of the water-soluble channel layer. In some embodiments, the non-aqueous solvent-based chemical is an organic aprotic solvent. An aprotic solvent is a solvent being free of labile hydron. Examples of the non-aqueous solvent-based chemical include propylene carbonate, ethanolamine, sulfolane, N-Methyl-2-pyrrolidone, dimethyl sulfoxide, dimethylacetamide or another suitable chemical. In order to help to increase a stability of the solvent when involving a chemical reaction, a potential window (also referred to as electrochemical window) of the non-aqueous solvent-based chemical ranges from about −4 volts to about +4 volts. Additionally, in order to help replace water with acids and bases during a wet oxidation process, a dielectric constant of the non-aqueous solvent-based chemical is greater than 20. In some embodiments, the non-aqueous solvent-based chemical is anhydrous (i.e., 0% water). The non-aqueous solvent-based chemical is mixed with, but is not limited to, oxidants such as hydrogen perhoxide, ozone, sulfuric acid, nitric acid, peroxydisulfuric acid, peroxymonosulfuric acid and surfactants to perform the wet oxidation process with the underlying channel layer. In some embodiments, the non-aqueous solvent-based chemical has a flash point greater than 60 degrees Celsius. The flash point is a lowest temperature at which a volatile material ignites when exposed to an ignition source. A lower flash point increases a possibility of ignition during the manufacturing process, in some instances.

In some embodiments, a thickness of the first oxide film ranges from about 5 Å to about 10 Å. A greater thickness increases manufacturing cost and time without significant benefit, in some instances. A smaller thickness increases Dit, in some embodiments. In at least one embodiment, a growth rate of the first oxide film ranges from about 0.5 Å per second to about 10 Å per second. One of ordinary skill in the art would understand the wet oxidation of the first oxide film happens even though the channel layer is not water soluble, such as a silicon channel layer.

In some embodiments, in order to help remove contaminants such as particles and ions, the non-aqueous solvent-based chemical is mixed with ammonium hydroxide, hydrogen chloride and/or hydrogen fluoride. In comparison with other approaches, a relatively slight loss of the channel layer and the first oxide film occurs because of the use of the non-aqueous solvent-based chemical. In some embodiments, a height difference between a bottom surface of the first oxide film and a bottom surface of the spacers ranges from about 0 Å to about 6 Å. That is, an oxide and/or the channel layer loss is from about 2 to 3 orders in volume smaller in comparison with other approaches. The use of the non-aqueous solvent-based chemical further provides a smoother surface at the interface between the first oxide film and the channel layer and the interface between the first oxide film and the gate dielectric film in comparison with oxide film forming using other approaches. In some embodiments, a root mean square (RMS) of roughness per micrometer square area ranges from about 1 Å to about 3 Å. The reduced oxide and the channel layer loss and smoother surface help to keep a stable saturation current (Idsat), a durable TBBD and a smaller Vt shift. As a result, an actual performance of the semiconductor device is closer to the designed performance than semiconductor devices formed using other processes. In some embodiments, based on a predetermined thickness of the first oxide film, the processing time of the wet oxidation lasts from about 10 seconds to about 15 minutes and the processing temperature ranges from about 25 degrees Celsius to about 65 degrees Celsius.

In some embodiments, the protective layer coated to fill the second trench is removed simultaneously during the formation of the first oxide film. In some embodiments, the removal of the protective layer is followed by the formation of the first oxide film. In some embodiments, a cleaning process, such as using hydrofluoric or ammonia hydroxide-hydrogen peroxide-water mixture (APM), is performed before the first oxide film is formed in the first trench.

In some embodiments, the second trench is not formed in operation 250 and operation 260 is omitted. In some embodiments where the second trench is not formed in operation 250, the second trench is formed in a separate operation, for example after forming the first oxide film in the first trench. In some embodiments, forming the second trench in a separate operation from forming the first trench increases a complexity of method 200 because additional patterning and etching operations are included in method 200.

FIGS. 3A-3H are cross-sectional views of a semiconductor device 300 at various stages of manufacturing in accordance with one or more embodiments.

Figure 3A:
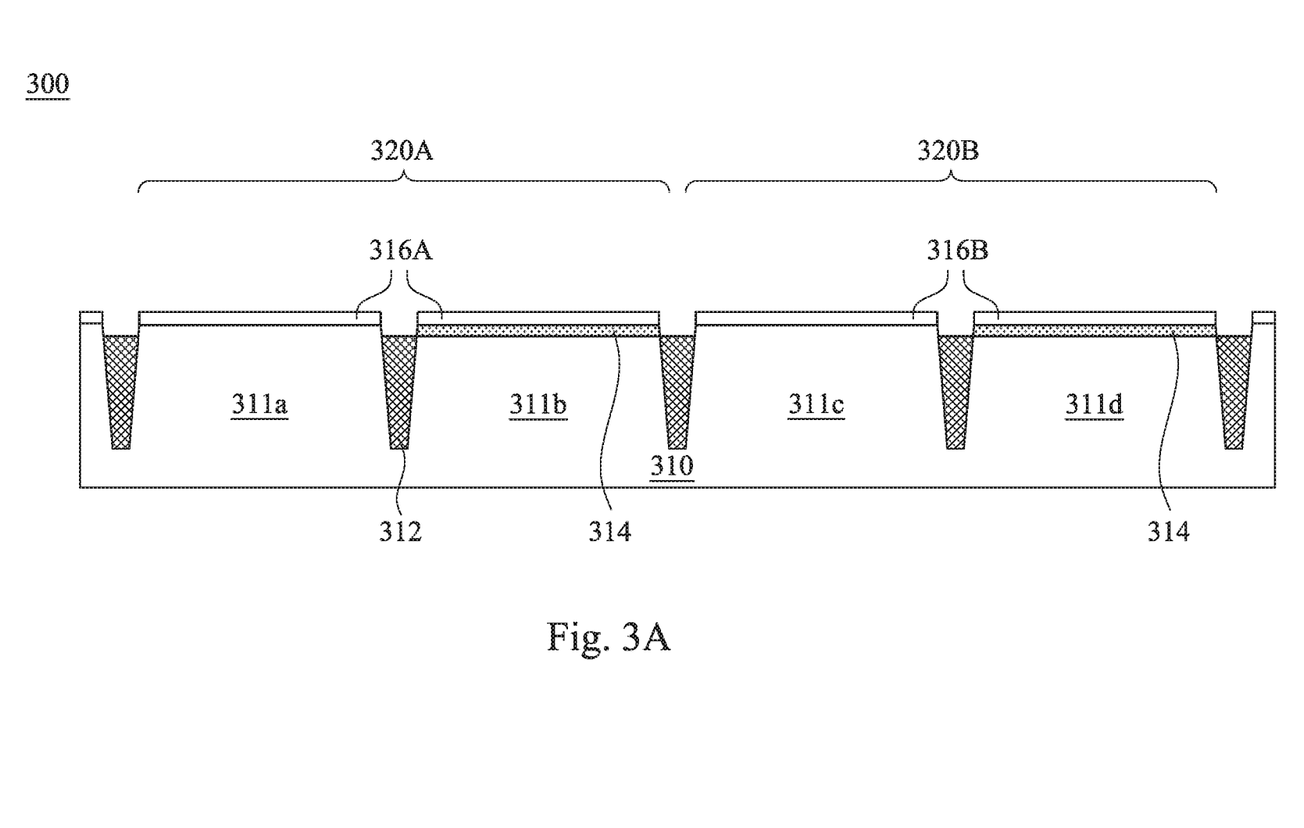
FIGS. 3A-3H are cross-sectional views of a semiconductor device at various stages of manufacturing in accordance with one or more embodiments.

Semiconductor device 300 includes elements similar to semiconductor device 100 and a last two digits of like elements are the same. FIG. 3A is a cross-sectional view of semiconductor device 300 following operation 210. Semiconductor device 300 includes a substrate 310, a plurality of fin structures 311 and a plurality of isolation features 312. Semiconductor device 300 further includes a first operating region 320A and a second operating region 320B. In some embodiments, first operating region 320A represents a core circuit region and second operating region 320B represents an I/O circuit region. First operating region 320A has a first insulating film 316A and second operating region 320B has a second insulating film 316B. In some embodiments, first insulating film 316A and second insulating film 316B are selectively formed over an active area of fin structure 111. In some embodiments, first insulating film 316A and second insulating film 316B cover isolation features 312. Each of first operating region 320A and second operating region 320B includes a channel layer 314. In some embodiments, channel layer 314 occupies a partial active area of first operating region 320A and second operating region 320B. In such a way, each operating region has at least two types of channel regions. In some embodiments, channel layer 314 occupies an entirety of the active area of at least one of first operating region 320A or second operating region 320B.

In some embodiments, channel layer 314 includes a germanium-containing material, such as germanium or silicon germanium for performance enhancement, especially in p-type devices. In some embodiments where fin structure 111 includes silicon in crystal, polycrystalline or amorphous structure, channel layer 314 is formed using an epitaxial growth or deposition process over a top surface of fin structure 111. In some embodiments, a portion of fin structure 111 is removed to form a recess and channel layer 314 is formed to fill in the recess. That is, a top surface of channel layer 314 is above, co-planar or below a top surface of the original top surface of fin structure 111. In some embodiments where fin structure 111 includes germanium, a channel layer is formed by a similar method described above to distinguish from channel layer 314.

Figure 3B:
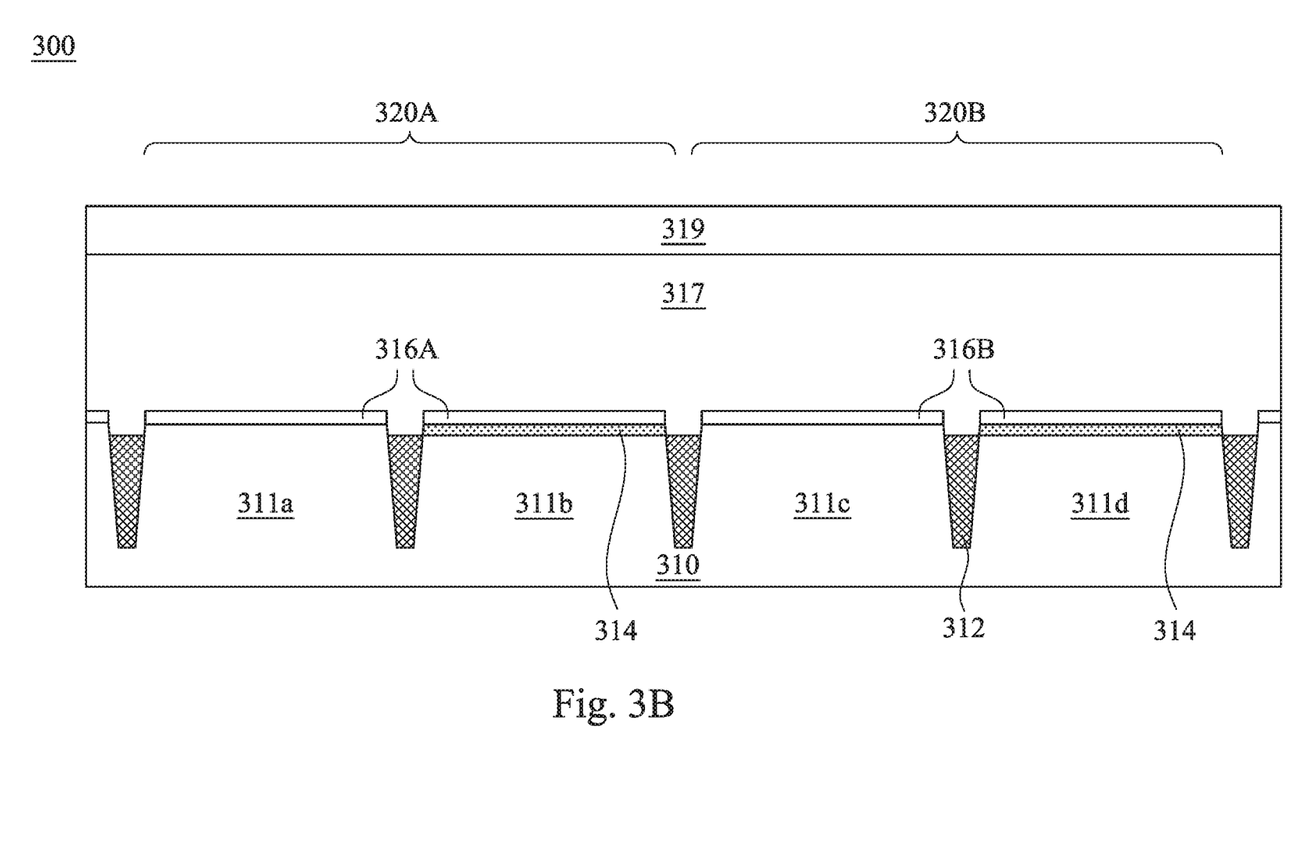

FIG. 3B is a cross-sectional view of semiconductor device 300 following operation 220. A sacrificial film 317 and a hard mask film 319 are formed over first insulating film 316A, second insulating film 316B and isolation features 112 by using a deposition process. In some embodiments, sacrificial film 317 is deposited by a same method as hard mask film 319. In some embodiments, sacrificial film 317 is deposited by a different method from hard mask film 319. Sacrificial film 317 has a different etching selectivity from that of hard mask film 319.

Figure 3C:
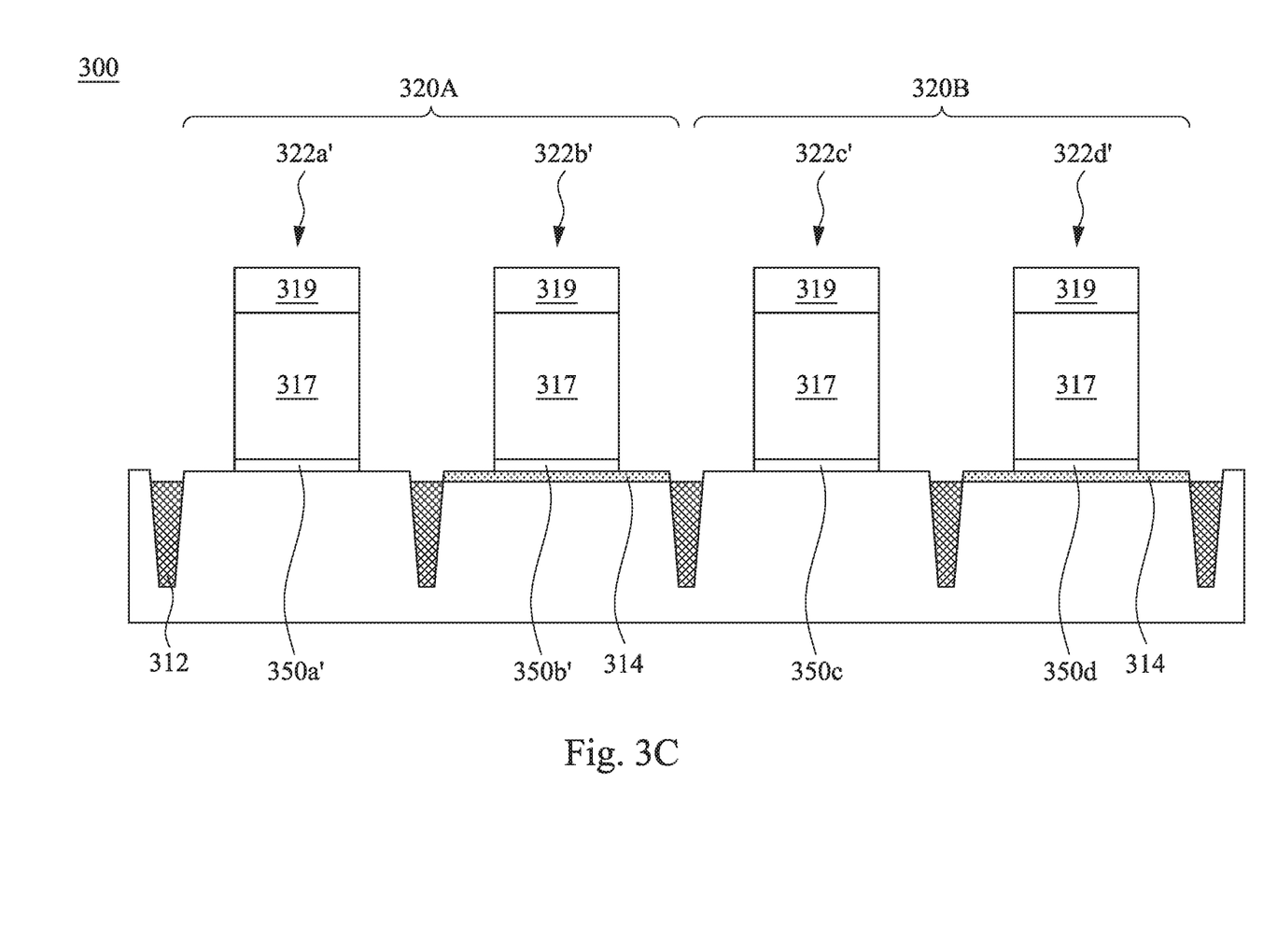

FIG. 3C is a cross-sectional view of semiconductor device 300 following operation 230. A plurality of gate stacks 322a'-d' is patterned and formed by using a lithography process and an etch process. After the etch process, first insulating film 316A and second insulating film 316B are separated to define ILs 350a', 350b', 350c and 350d. In at least one embodiment, gate stack 322a' is an n-type core device, gate stack 322b' is a p-type core device, gate stack 322c' is an n-type I/O device and gate stack 322d' is a p-type I/O device.

Figure 3D:
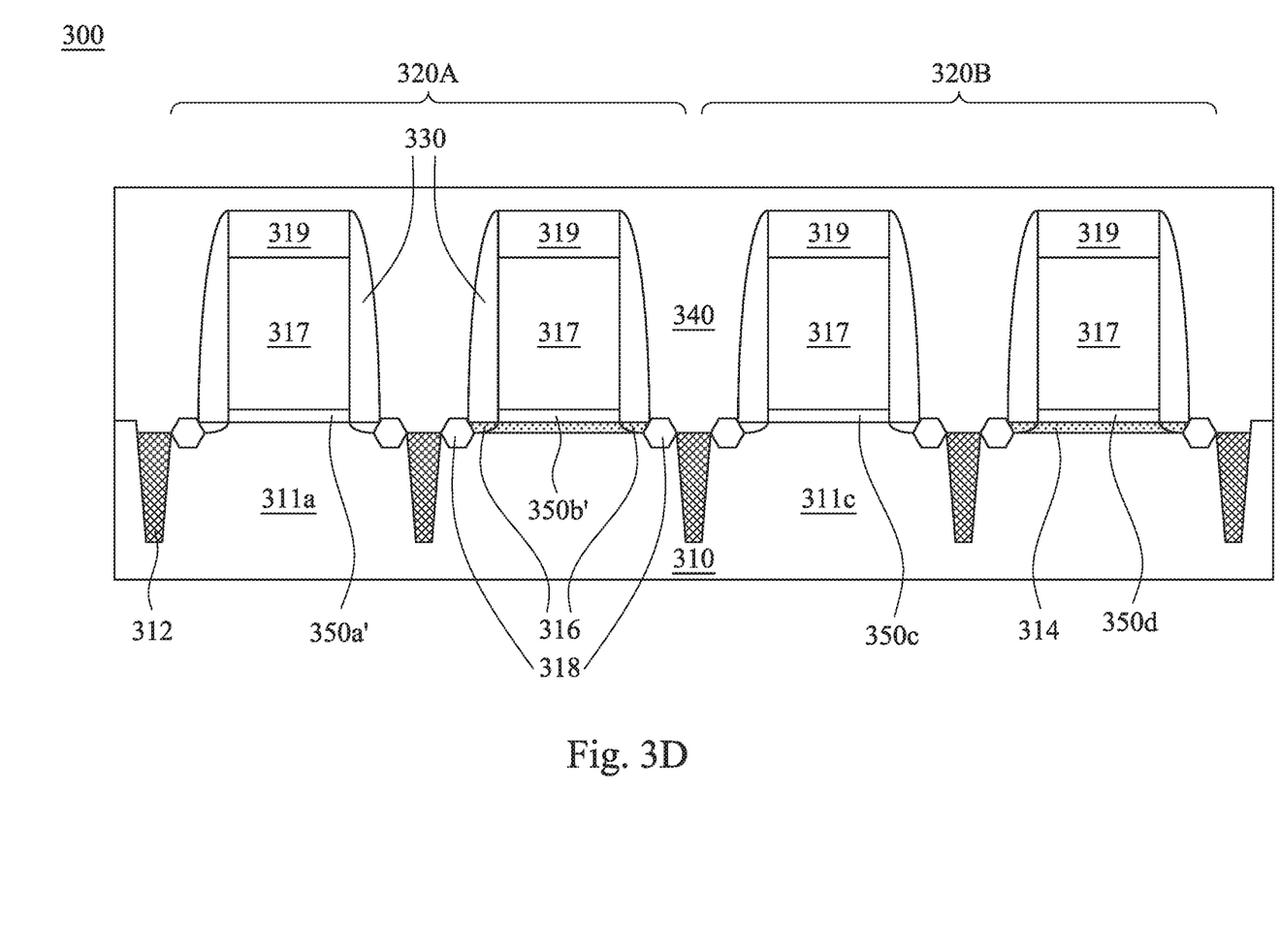

FIG. 3D is a cross-sectional view of semiconductor device 300 following operation 240. LDD regions 316 are formed at opposite sides of gate stacks 322a'-d'. The formation of LDD region 316 includes one or more implantation processes. Each LDD region 316 includes various dopants based on a conductivity type. Next, spacers 330 are formed along sidewalls of gate stacks 322a'-d' and define a location of source/drain features 318. Similarly, each source/drain region includes various dopants based on the conductivity type. Semiconductor device 300 further includes an ILD 340 deposited over gate stacks 322a'-d' and fin structures 111.

Figure 3E:
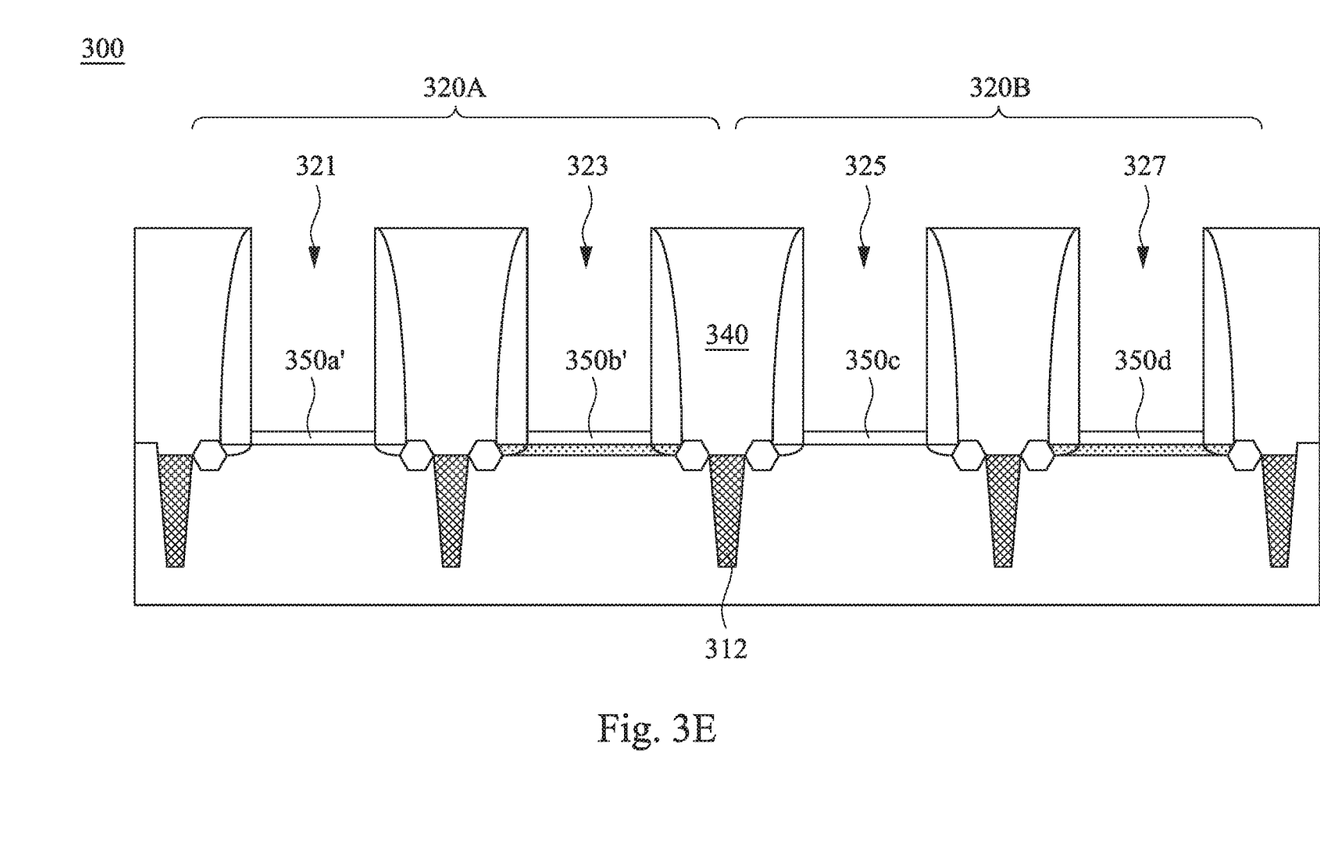

FIG. 3E is a cross-sectional view of semiconductor device 300 following operation 250. In some embodiments, a planarization process is applied to expose sacrificial film 317 and remove upper portions of spacers 330. Next, sacrificial film 317 is removed to expose ILs 350a' 350b' 350c and 350d. Trenches 321, 323, 325 and 327 are formed in ILD 340. In some embodiments, a contact opening is formed in ILD 340 and is then filled with a conductive material to form a contact plug to electrically connect with source/drain features 318.

Figure 3F:
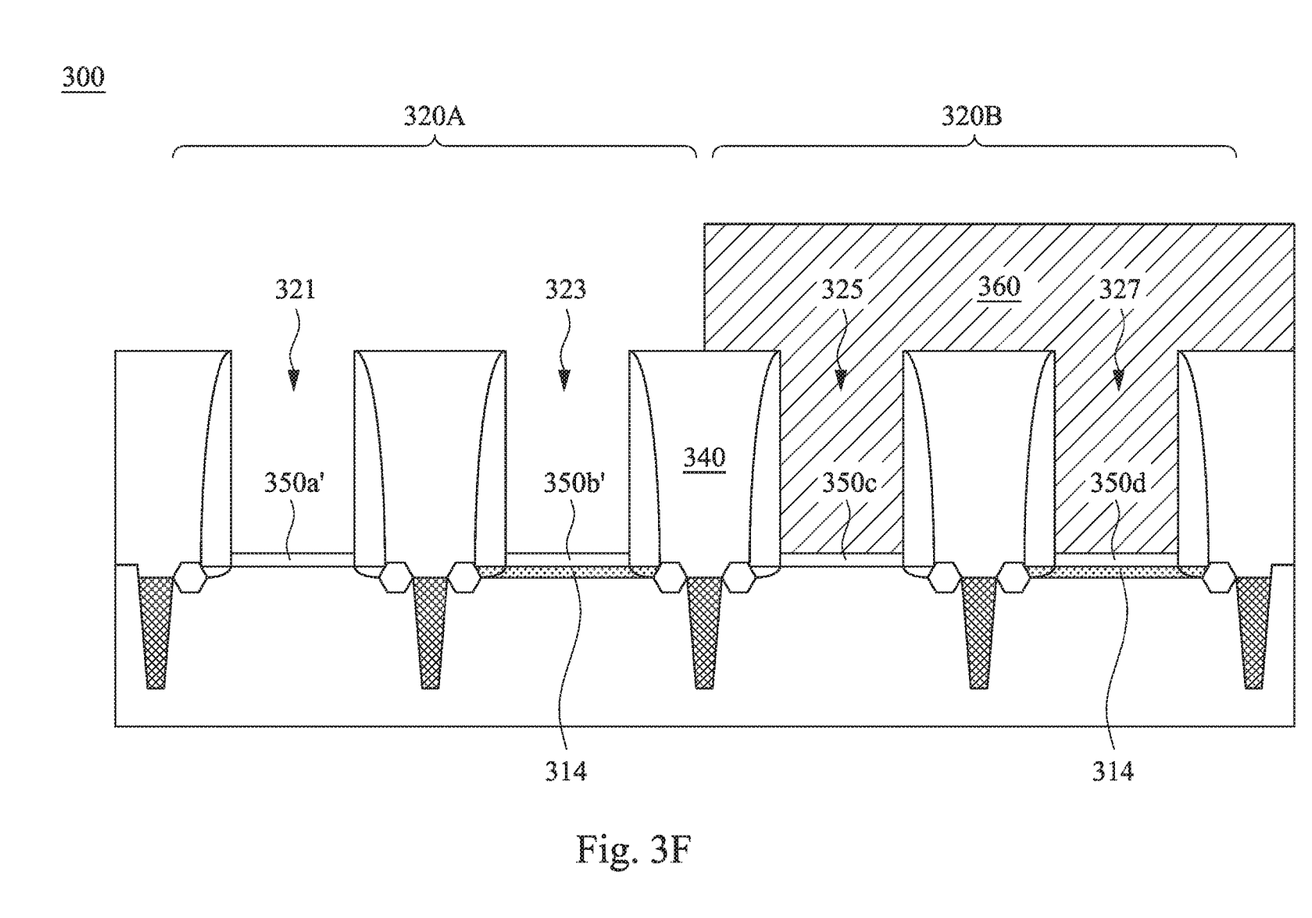

FIG. 3F is a cross-sectional view of semiconductor device 300 following operation 260. In some embodiments where a thickness of IL 350c and 350d satisfies a thickness of I/O devices, a protective layer 360 coats over and fills trenches 325 and 327. In some embodiments, protective layer 360 includes a photoresist. In some embodiments, protective layer 360 covers an entirety of second operating region 320B.

Figure 3G:
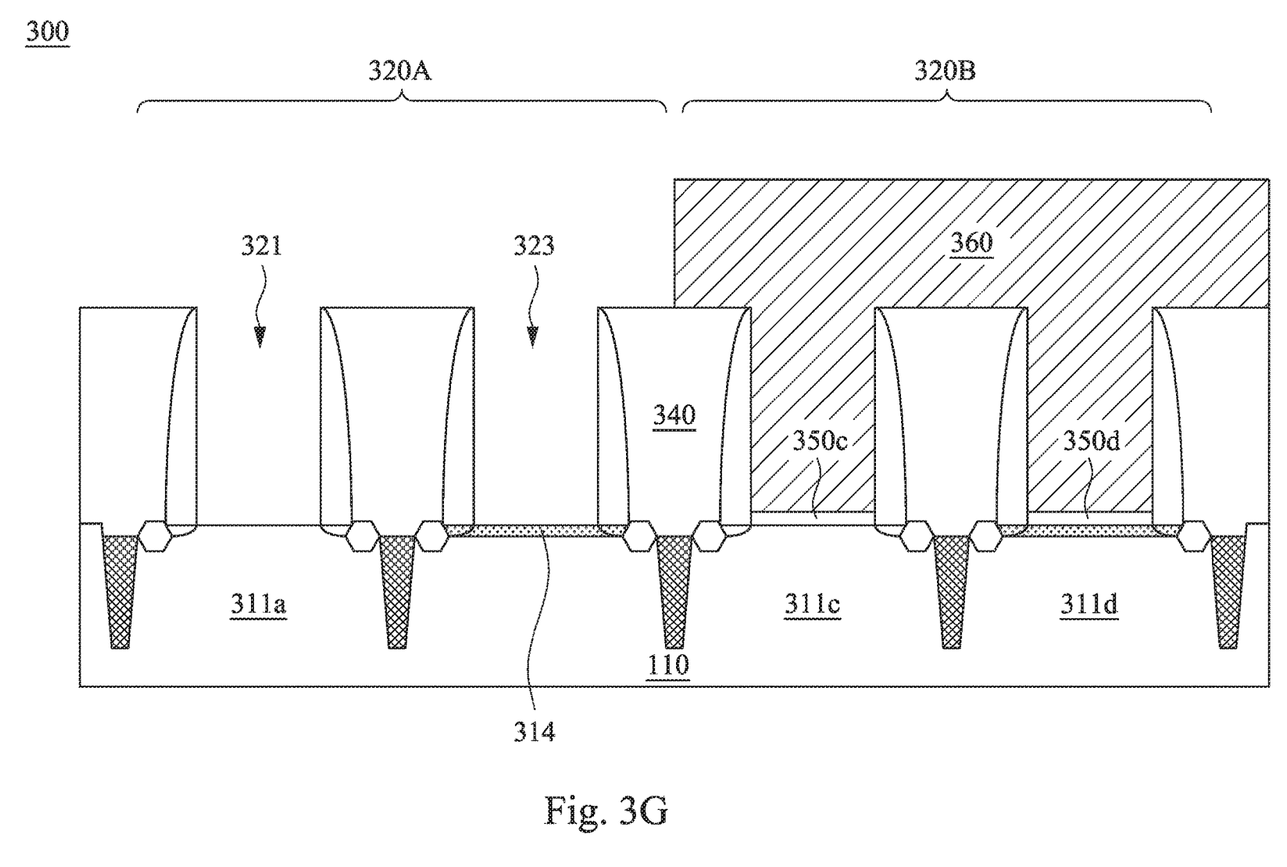

FIG. 3G is a cross-sectional view of semiconductor device 300 following operation 270. IL 350a' and 350b' are removed using wet etching processes, dry etching processes, or a combination thereof. In some embodiments, IL 350a' and 350b' are removed in a single step. In some embodiments, IL 350a' and 350b' are removed in sequential steps.

Figure 3H:
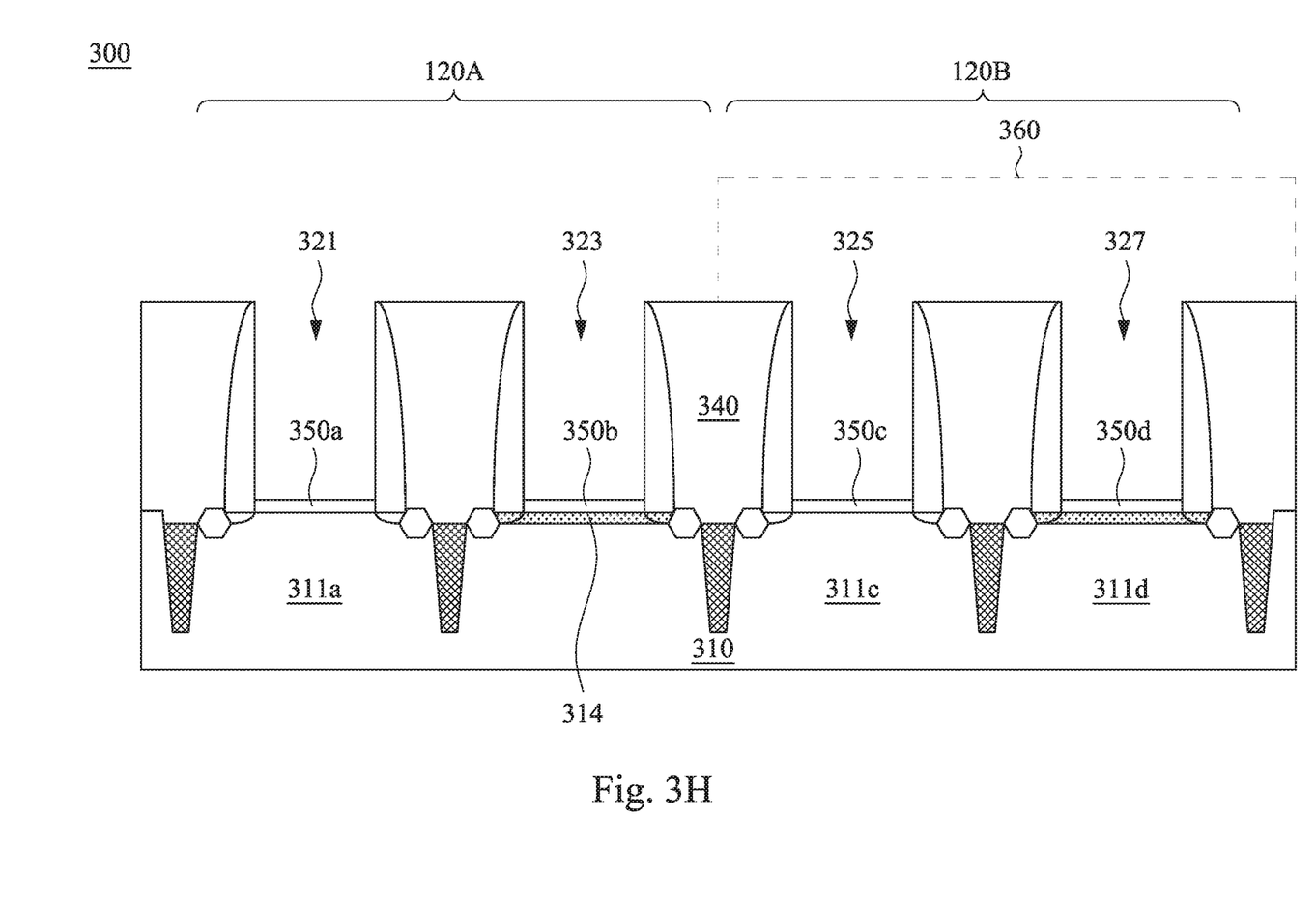

FIG. 3H is a cross-sectional view of semiconductor device 300 following operation 280. In some embodiments where an oxide grown from channel layer 314 is water-soluble, such as germanium dioxide or silicon germanium dioxide, an IL 350a and an IL 350b are simultaneously formed over the exposed portion of fin structure 311 using a non-aqueous solvent-based chemical. In some embodiments where channel layer 314 is made of silicon germanium, a percentage of germanium dioxide in IL 350b is proportional to a percentage of germanium in channel layer 340. In some embodiments, IL 350a includes a same oxide as IL 350b. In some embodiments where channel layer 314 includes germanium and fin structure 311a includes silicon, IL 350a includes a different oxide, such as silicon oxide, from IL 350b, such as germanium oxide.

Figure 4:
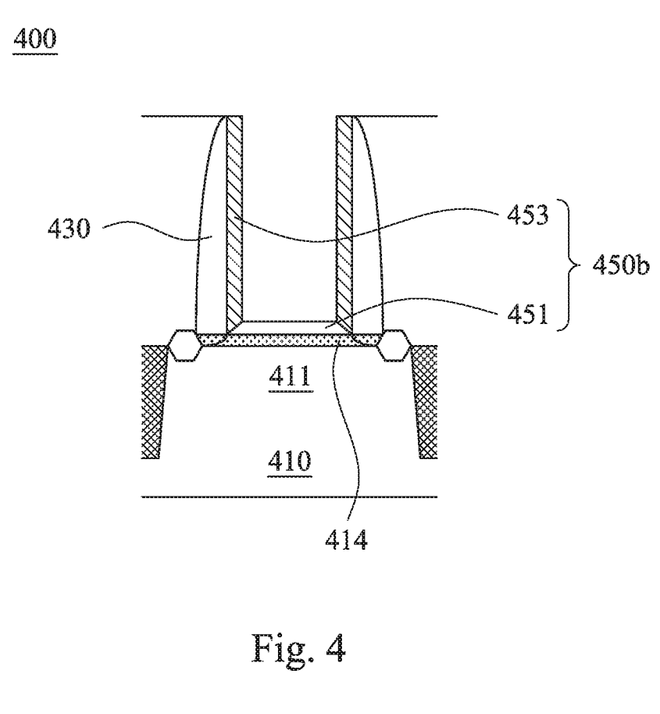
FIG. 4 is a cross-sectional view of a semiconductor device in accordance with one or more embodiments.

FIG. 4 is a cross-sectional view of a semiconductor device 400 in accordance with one or more embodiments. Semiconductor device 400 includes elements similar to semiconductor device 100 and a last two digits of like elements are the same. Semiconductor device 400 has a U shape IL 450b located in a cavity defined by a fin structure 411 and spacers 430. IL 450b includes a first portion 451 that is in parallel with a channel layer 411 and a second portion 453 that is perpendicular to channel layer 411. In some embodiments, an oxidation process occurs along sidewalls of spacers 430 during the formation of IL 450b. In some instance where spacer 430 includes silicon atoms, for example, silicon nitride or silicon carbonitride, second portion 453 includes silicon dioxide simultaneously when forming first portion 451. Therefore, in some embodiments, when spacers 430 include germanium atoms, first portion 451 includes a same material as second portion 453; in some embodiments, when spacers 430 include silicon atoms, first portion 451 includes a different material from second portion 453.

One aspect of this description relates to a method of manufacturing a semiconductor structure. The method includes forming a first insulating film over a first fin structure and a second insulating film over a second fin structure, coating a protective layer over the second insulating film, removing the first insulating film to expose a portion of the first fin structure, and forming a first oxide film over the exposed portion of the first fin structure using a non-aqueous solvent-based chemical. In some embodiments, the forming of the first oxide film includes using an organic aprotic solvent. In some embodiments, the forming of the first oxide film includes using an aqueous solution having a concentration smaller than 8% of the non-aqueous solvent-based chemical. In some embodiments, the forming of the first oxide film includes using an anhydrous solvent-based chemical. In some embodiments, the forming of the first oxide film includes using propylene carbonate, ethanolamine, sulfolane, N-Methyl-2-pyrrolidone, dimethyl sulfoxide, or dimethylacetamide. In some embodiments, the forming of the first oxide film includes using hydrogen perhoxide, ammonium hydroxide, hydrogen chloride, hydrogen fluoride, ozone, sulfuric acid, nitric acid, peroxydisulfuric acid, or peroxymonosulfuric acid. In some embodiments, the method further includes removing the protective layer to expose the second insulating film. In some embodiments, the removing of the protective layer includes forming the first oxide film and removing the protective layer in a single step. In some embodiments, the removing of the protective layer includes forming the first oxide film and removing the protective layer in sequential steps. In some embodiments, the forming of the first oxide film includes forming the first oxide film to include at least two oxide materials.

Another aspect of this description relates to a method of fabricating a semiconductor device. The method includes forming a first insulating film over a first fin structure and a second insulating film over a second fin structure, depositing a sacrificial film over the first insulating film and the second insulating film, form a first gate stack and a second gate stack using an etch process, depositing an inter-layer dielectric (ILD) over the first gate stack and the second gate stack, removing the sacrificial film to form a first trench and a second trench in the ILD, coating a protective layer to fill the second trench, removing the first insulating film from the first trench, and forming a first oxide film in the first trench using a non-aqueous solvent-based chemical. In some embodiments, the method further includes forming a channel layer over the first fin structure, wherein the channel layer is aqueous soluble. In some embodiments, the forming of the first oxide film includes growing the first oxide film at a growth rate ranging from about 0.5 Å per second to about 10 Å per second. In some embodiments, the forming of the first oxide film includes growing the first oxide film at a temperature ranging from about 25 degrees Celsius to about 65 degrees Celsius. In some embodiments, the forming of the first oxide film includes forming the first oxide film to have a same compound as the second insulating film. In some embodiments, the forming of the first oxide film includes forming the first oxide film to have a different compound from the second insulating film. In some embodiments, the method further includes forming a third insulating film over a third fin structure, forming the third stack using the etch process, depositing the ILD over the third gate stack, removing the sacrificial film to form a third trench in the ILD, removing the third insulating film form the third trench, and forming a third oxide film in the third trench using the non-aqueous solvent-based chemical. The third oxide film includes a different material from the first oxide film.

Still another aspect of this description relates to a semiconductor IC. The semiconductor IC includes a fin structure having an aqueous soluble channel layer, and a gate structure over the aqueous soluble channel layer. The gate structure includes an oxide film, a gate dielectric film and a gate electrode. The semiconductor IC further includes spacers along the gate structure. An interface between the spacers and the aqueous soluble channel layer is from about 0 Å to about 6 Å higher than an interface between the oxide film and the aqueous soluble channel layer. In some embodiments, the oxide film has a first portion substantially perpendicular to the aqueous soluble channel layer and a second portion substantially parallel to the aqueous soluble channel layer. The first portion includes a different oxide compound form that of the second portion.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   forming a first insulating film over a first fin structure and a second insulating film over a second fin structure;
   coating a protective layer over the second insulating film;
   removing the first insulating film to expose a portion of the first fin structure; and
   forming a first oxide film over the exposed portion of the first fin structure using a non-aqueous solvent-based chemical.

2. The method of claim 1, wherein the forming of the first oxide film comprises:
   using an organic aprotic solvent.

3. The method of claim 1, wherein the forming of the first oxide film comprises:
   using an aqueous solution having a concentration smaller than 8% of the non-aqueous solvent-based chemical.

4. The method of claim 1, wherein the forming of the first oxide film comprises:
   using an anhydrous solvent-based chemical.

5. The method of claim 1, wherein the forming of the first oxide film comprises:
   using propylene carbonate, ethanolamine, sulfolane, N-Methyl-2-pyrrolidone, dimethyl sulfoxide, or dimethylacetamide.

6. The method of claim 1, wherein the forming of the first oxide film comprises:
   using hydrogen perhoxide, ammonium hydroxide, hydrogen chloride, hydrogen fluoride, ozone, sulfuric acid, nitric acid, peroxydisulfuric acid, or peroxymonosulfuric acid.

7. The method of claim 1, further comprising:
   removing the protective layer to expose the second insulating film.

8. The method of claim 7, wherein the removing of the protective layer comprises:
   performing the forming of the first oxide film and the removing of the protective layer in a single step.

9. The method of claim 7, wherein the removing of the protective layer comprises:
   performing the forming of the first oxide film and the removing of the protective layer in sequential steps.

10. The method of claim 1, wherein the forming of the first oxide film comprises:
    forming the first oxide film to include at least two oxide materials.

11. A method of fabricating a semiconductor device, the method comprising:
    forming a first insulating film over a first fin structure and a second insulating film over a second fin structure;
    depositing a sacrificial film over the first insulating film and the second insulating film;
    forming a first gate stack and a second gate stack using an etch process;
    depositing an inter-layer dielectric (ILD) over the first gate stack and the second gate stack;
    removing the sacrificial film to form a first trench and a second trench in the ILD;
    coating a protective layer to fill the second trench;
    removing the first insulating film from the first trench; and
    forming a first oxide film in the first trench using a non-aqueous solvent-based chemical.

12. The method of claim 11, further comprising:
    forming a channel layer over the first fin structure, wherein the channel layer is aqueous soluble.

13. The method of claim 12, wherein the forming of the first oxide film comprises:
    growing the first oxide film at a growth rate ranging from about 0.5 angstrom (Å) per second to about 10 Å per second.

14. The method of claim 11, wherein the forming of the first oxide film comprises:
    growing the first oxide film at a temperature ranging from about 25 degrees Celsius to about 65 degrees Celsius.

15. The method of claim 11, wherein the forming of the first oxide film comprises:
    forming the first oxide film to have a same compound as the second insulating film.

16. The method of claim 11, wherein the forming of the first oxide film comprises:
    forming the first oxide film to have a different compound from the second insulating film.

17. The method of claim 11, further comprising:
    forming a third insulating film over a third fin structure;
    forming a third gate stack using the etch process;
    depositing the ILD over the third gate stack;
    removing the sacrificial film to form a third trench in the ILD;
    removing the third insulating film from the third trench; and
    forming a third oxide film in the third trench using the non-aqueous solvent-based chemical, wherein the third oxide film includes a different material from the first oxide film.

18. The method of claim 11, further comprising:
    depositing a hard mask film over the sacrificial film;
    forming spacers along sidewalls of the first gate stack and the second gate stack;
    planarizing the ILD to remove the hard mask film; and
    depositing a gate dielectric film over the first oxide layer; and
    depositing a gate electrode over the gate dielectric.

19. A method of manufacturing a semiconductor device, the method comprising:
    removing a scarification film to define a first trench in a first fin structure and to define a second trench in a second fin structure;
    filling the second trench with a protective layer;
    removing the protective film from the second trench; and
    forming a first oxide film in the first trench simultaneously with the removing of the protective film from the second trench.

20. The method of claim 19, wherein the forming of the first oxide film comprises using a non-aqueous solvent-based chemical.

* * * * *